(12) United States Patent
Guo

(10) Patent No.: US 12,727,398 B2
(45) Date of Patent: Sep. 1, 2026

(54) RRAM CELL AND FABRICATION METHOD THEREFOR

(71) Applicant: SHANGHAI IC R & D CENTER CO., LTD., Shanghai (CN)

(72) Inventor: Ao Guo, Shanghai (CN)

(73) Assignees: SHANGHAI IC R & D CENTER CO., LTD., Shanghai (CN); SHANGHAI INTEGRATED CIRCUIT EQUIPMENT & MATERIALS INDUSTRY INNOVATION CENTER CO., LTD, Shanghai (CN)

( * ) Notice: Subject to any disclaimer, the term of this patent is extended or adjusted under 35 U.S.C. 154(b) by 815 days.

(21) Appl. No.: 17/915,137

(22) PCT Filed: Dec. 22, 2020

(86) PCT No.: PCT/CN2020/138330
§ 371 (c)(1),
(2) Date: Sep. 28, 2022

(87) PCT Pub. No.: WO2021/203736
PCT Pub. Date: Oct. 14, 2021

(65) Prior Publication Data

US 2023/0157188 A1 May 18, 2023

(30) Foreign Application Priority Data

Apr. 7, 2020 (CN) ......................... 202010263682.0

(51) Int. Cl.
*H10N 70/00* (2023.01)
*H10B 63/00* (2023.01)
*H10N 70/20* (2023.01)

(52) U.S. Cl.
CPC ......... *H10N 70/8833* (2023.02); *H10B 63/34* (2023.02); *H10N 70/023* (2023.02); *H10N 70/063* (2023.02); *H10N 70/253* (2023.02)

(58) Field of Classification Search
CPC ............................ H10N 70/253; H10N 70/20
See application file for complete search history.

(56) References Cited

U.S. PATENT DOCUMENTS

2004/0114428 A1* 6/2004 Morikawa .............. H10B 63/30 365/158
2008/0298113 A1* 12/2008 Liu .................... G11C 13/0004 257/E47.001

(Continued)

FOREIGN PATENT DOCUMENTS

CN 108155202 A1 6/2018

*Primary Examiner* — Leonard Chang
*Assistant Examiner* — Hajar Kolahdouzan
(74) *Attorney, Agent, or Firm* — Bayramoglu Law Offices LLC

(57) ABSTRACT

The present invention is to provide a RRAM cell, comprising: two transistors which are coupled and resistive switching cells, and the number of the resistive switching cells is n; wherein electrodes of the resistive switching cells are connected in sequence to form a horizontal stack structure, and the same electrode is shared between any two adjacent resistive switching cells, the gates of the two transistors are used for applying different control signals respectively, the sources of the two transistors are connected together and used for applying a source signal jointly, drains of the two transistors are connected to one end of each of electrodes of different resistive switching cells which the number thereof is m in the resistive switching cells which the number thereof is n respectively, and the other ends of the electrodes of the resistive switching cells which the number thereof is n are used for applying different bit signals respectively. According to the present invention. Based on vertical chan- (Continued)

nel transistors and resistance switching cells with a horizontal stacked structure, a 2TnR RRAM is formed in the present invention, which can simultaneously realize binary and multi value storage functions according to different operation timings, and cell area is controllable. It can be used to realize a high-density RRAM array and chip.

8 Claims, 7 Drawing Sheets

(56) References Cited

U.S. PATENT DOCUMENTS

| | | | | |
|---|---|---|---|---|
| 2015/0372055 | A1 * | 12/2015 | Chen | H10B 61/22 257/421 |
| 2021/0074765 | A1 * | 3/2021 | Reznicek | H10D 62/151 |

* cited by examiner

=Prior Art=

=Prior Art=

=Prior Art=

=Prior Art=

RRAM CELL AND FABRICATION METHOD THEREFOR

CROSS-REFERENCE TO RELATED APPLICATION

This application claims priority of Chinese Patent Application Serial No. CN202010263682.0, filed Apr. 7, 2020. The entirety of each of the above-mentioned patent applications is hereby incorporated herein by reference and made a part of this specification.

TECHNICAL FIELD

The disclosure relates to the technical field of memory, in particular to a RRAM cell capable of realizing binary or multi-value operations and a fabrication method therefor.

BACKGROUND

RRAM (Resistive Random Access Memory) is a new kind of non-volatile memory, which has advantages of high speed, low power consumption, non-volatility, high integration and compatibility with CMOS technology. In recent years, it has become one of research hotspots in technical field of novel memory, even commercial products are available.

The cell structure of the RRAM is a core of RRAM technology, based on a RRAM cell, a RRAM array can be constructed and a RRAM chip can be realized.

At present, a mainstream RRAM cell structure is usually a 1T1R structure, and its typical schematic diagram is shown in FIG. 1-2. that is, a transistor (T) and a resistive switching cell (R) are connected in series to form an RRAM cell. Wherein, the transistor is usually a planar MOS transistor, which can be formed by a CMOS front-end process; then, a resistive switching stack (RRAM stack) of a resistive switching cell can be integrated through back-end metal interconnection layers, so as to form a 1T1R cell which is compatible with a CMOS process.

The basic working principle of the traditional 1T1R cell is as follows: providing a control signal Vg to the gate of the transistor to control gating of the resistive switching cell, the drain of the transistor is connected to the resistive switching cell, providing a bit signal Vbit to the output terminal of the resistive switching cell, and providing a source signal Vs to the source of the transistor, through different timing combinations of Vg, Vbit and Vs, various operations of the resistive switching cell are realized, comprising forming, data set/reset and data read, etc.

Traditional 1T1R cells are usually binary storage, that is, there are only two stable resistance states. To realize multi-value storage (that is, to generate more than two stable resistive states), it is generally necessary to connect a plurality of resistive switching cells (that is, a 1TnR structure) in parallel.

However, an existing resistive switching layer structure is generally a vertical stacking structure, that is, a vertical sandwich structure composed of an upper electrode, a resistive switching layer and a lower electrode. To realize the 1TnR cell structure, it is usually necessary to connect a plurality of resistive switching cells (R1, R2, etc.) in parallel in the horizontal direction, that is, the drain of the transistor is connected to a lower electrode of each of the resistive switching cells, and upper electrodes (leading-out ends) of the resistive switching cells are connected to different bit signals respectively, such as Vbit1, Vbit2, etc., and a structure thereof are shown in FIG. 3-4. However, limited by process rules such as line width and spacing, cell area of a conventional 1TnR structure is usually significantly increased, which is not conducive to realized high-density integration.

Therefore, exploring RRAM cells that can be used for multi-value storage is still one of the key research directions in a field of RRAM technology.

SUMMARY

The purpose of the present invention is to overcome the above-mentioned defects existing in the prior art, and to provide a RRAM cell and a preparation method therefor. Based on a vertical channel transistor and a resistive change cell with a horizontal stack structure, a RRAM is formed in a form of 2TnR, according to different operation timing, it can realize binary and multi-value storage functions simultaneously, and cell area thereof is controllable, which can be used to realize high-density RRAM arrays and chips.

For achieving the above object, technical scheme of the present invention is as follows: A RRAM cell, comprising: two transistors which are coupled and resistive switching cells, and the number of the resistive switching cells is n; wherein electrodes of the resistive switching cells are connected in sequence to form a horizontal stack structure, and the same electrode is shared between any two adjacent resistive switching cells; gates of the two transistors are used for applying different control signals respectively, sources of the two transistors are connected together and used for applying a source signal jointly; drains of the two transistors are connected to one end of each of electrodes of different resistive switching cells which the number thereof is m in the resistive switching cells which the number thereof is n respectively, and the other ends of the electrodes of the resistive switching cells which the number thereof is n are used for applying different bit signals respectively; wherein, n and m are positive integers, n is twice as large as m and is not less than 2.

Further, the two transistors are set on a semiconductor substrate, a dielectric layer is set on surface of the semiconductor substrate, and the resistive switching cells are set on the dielectric layer, the transistors and the resistive switching cells are connected through a metal interconnection layer in the dielectric layer.

Further, a raised cuboid is set on the surface of the semiconductor substrate, a common source of the two transistors is set on top surface of the raised cuboid, the gates of the two transistors are set on two sides of the raised cuboid respectively, the drains of the two transistors are set on the semiconductor substrates adjacent to the two sides of the raised cuboid respectively; gate dielectric layers are set between the gates and the semiconductor substrate, channels of the two transistors are set in the raised cuboid jointly, and vertical channel structures are formed respectively.

Further, layout area of two transistors is equivalent to a planar MOS transistor; wherein, layout area of sources of the two transistors is equivalent to gate of the planar MOS transistor, and layout area of drains of the two transistors is equivalent to source and drain of the planar MOS transistor, the gates of the two transistors are corresponding to two gate sidewalls of the planar MOS transistor.

Further, each of the resistive switching cells is a horizontal sandwich structure and comprises a left electrode, a resistive switching layer and a right electrode which are set in sequence, any two adjacent resistive switching cells are connected with the respective left electrodes thereof or the respective right electrodes thereof, so as to form a common electrode.

Further, material of the left electrodes and the right electrodes comprise Ta, Ti, Cu, W, Pt, TaN or TiN, material of the resistive switching layer comprises tantalum oxide, hafnium oxide or titanium oxide.

A fabrication method for the RRAM cell of claim 3, comprising:

- S1: providing a planar silicon substrate, defining device regions of two parallel transistors on the silicon substrate, and forming the raised cuboid on the silicon substrate in the device region;
- S2: forming the common source of the two transistors on the top surface of the raised cuboid, and forming the drains of the two transistors on the semiconductor substrates adjacent to the two sides of the raised cuboid respectively;
- S3: forming the gate dielectric layers of the two transistors on the two sides of the raised cuboid and the surface of the semiconductor substrate adjacent to the two sides of the raised cuboid respectively;
- S4: forming sidewall gates of the two transistors on the gate dielectric layers on the two sides of the raised cuboid respectively;
- S5: forming a dielectric layer on the surface of the silicon substrate, forming a metal interconnection layer in the dielectric layer, and forming the resistive switching cells on the metal interconnection layer, and the number of the resistive switching cells is n.

Further, using a standard CMOS ion implantation process to form the sources and the drains, forming the gate dielectric layers by a thermal oxidation process or an atomic layer deposition process, and forming the gates by a self-aligned spacer process of standard CMOS processes.

Further, a method for forming the resistive switching cells specifically comprises:

- S51: forming first electrodes on the dielectric layer, and the number of the first electrodes is m;
- S52: depositing a resistive switching layer on surface of the first electrodes;
- S53: forming a sidewall resistive switching layer on two sides of the first electrodes through a sidewall etching process;
- S54: depositing second electrode layer material to cover the first electrodes, planarizing the second electrode layer material, and forming second electrodes between the first electrodes, and the number of the second electrodes is m, thereby forming resistive switching cells, and the number of the resistive switching cells is n; wherein, the first electrodes or the second electrodes are electrodes shared between any two adjacent resistive switching cells.

A RRAM cell, comprising: a transistor and two resistive switching cells which are connected, wherein electrodes of the two resistive switching cells are connected in sequence to form a horizontal stack structure, and one of the electrodes is shared between the two resistive switching cells;

gate of the transistor is used for applying a control signal respectively, source of the transistor is used for applying a source signal; drain of the transistor is connected to one end of each of the electrodes of the two resistive switching cells, and the other end s of the electrodes of the two resistive switching cells are used for applying different bit signals respectively.

The RRAM cell proposed by the present invention is in a form of 2TnR, which comprises two vertical channel transistors and resistance variable cells with a horizontal stacked structure, and the number of the resistance variable cells is n, wherein vertical transistors and horizontal resistance switching cells are formed by a sidewall process, which can completely realize parallel connection of multiple resistance switching cells under a limited cell area, and realize the binary and multi-value storage functions simultaneously by different operation modes. Meanwhile, a preparation method of the cell structure can be compatible with standard CMOS processes and a current mainstream RRAM process technology. It is very suitable for implementation of large-scale resistive memory arrays and chips, and application values thereof is very important in fields of memory computing integration and neural network chip in the future, which is a new resistive memory technology with very promising applications.

DETAILED DESCRIPTION

The specific embodiments of the present invention will be further described in detail below with reference to the accompanying drawings.

It should be noted that, in the following specific embodiments, when describing the embodiments of the present invention in detail, in order to clearly represent the structure of the present invention and facilitate the description, the structures in the accompanying drawings are not drawn according to the general scale, and the Partial enlargement, deformation and simplification of processing are shown, therefore, it should be avoided to interpret this as a limitation of the present invention.

In the following specific implementation of the present invention, please refer to FIG. 5, which is a schematic structural diagram of a RRAM cell in a form of 2TnR according to a preferred embodiment of the present invention.

Figure 1:
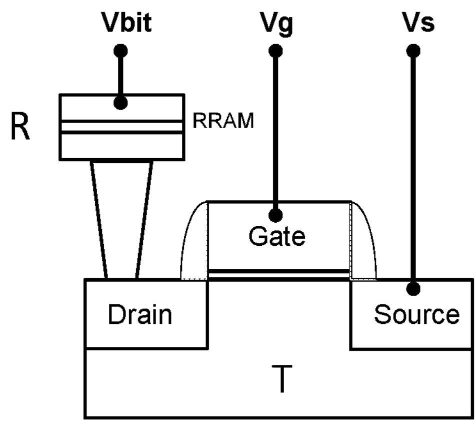
FIG. 1-2 are schematic diagrams of a device structure and a circuit principle of an existing 1T1R RRAM cell.
Figure 2:
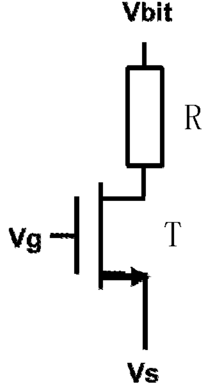
Figure 3:
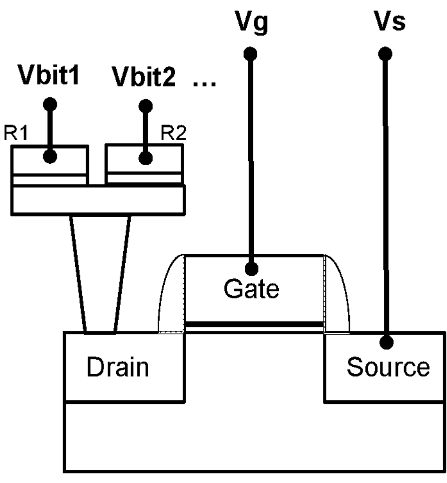
FIG. 3-4 are schematic diagrams of a device structure and a circuit principle of an existing 1TnR RRAM cell.
Figure 4:
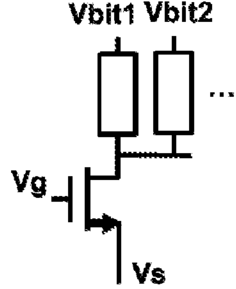
Figure 5:
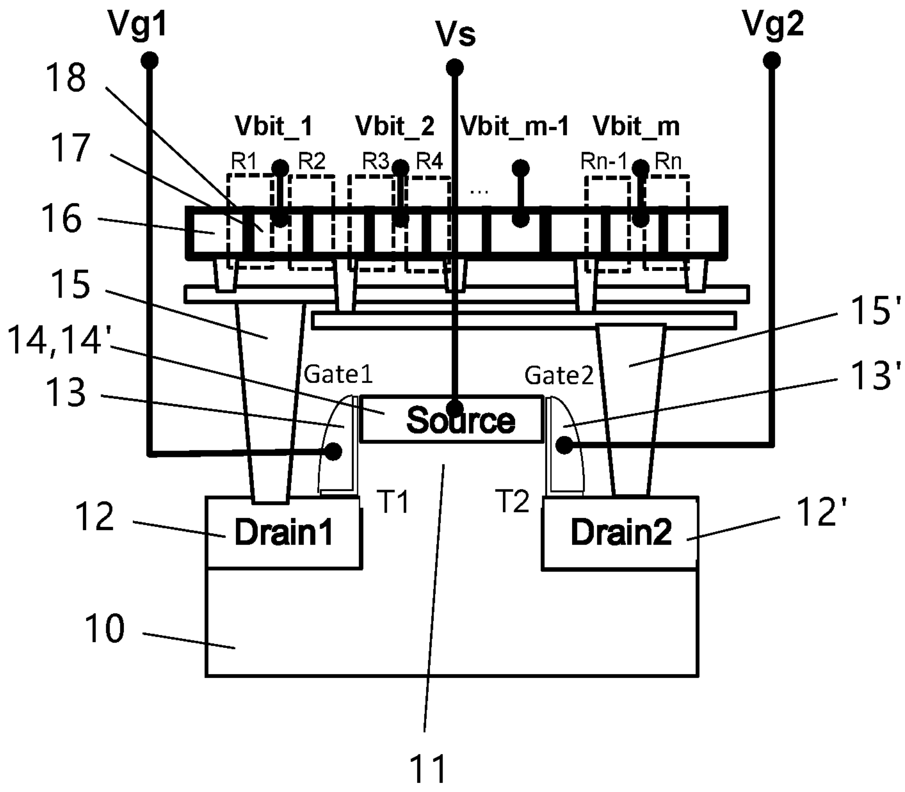
FIG. 5 is a schematic structural diagram of a RRAM cell in a form of 2TnR according to a preferred embodiment of the present invention.

As shown in FIG. 5, a RRAM cell structure proposed by the present invention is a RRAM cell structure in the form of 2TnR, which comprises two transistors which are coupled T1 and T2 and resistive switching cells R1 and R2, . . . , Rn, and the number of the resistive switching cells is n. It is actually composed of two 1TmR RRAM cell structures connected in parallel, wherein: n and m are positive integers, n is twice as large as m and is not less than 2.

Specifically, the transistor T1 is connected to part of resistive switching cells and the number thereof is m, so as to form a 1TmR structure; the transistor T2 is connected to the other part of resistive switching cells and the number thereof is m, so as to form another 1TmR structure. In addition, sources 14 and 14' of the two transistors T1 and T2 are connected to form a common source 14 and 14', which is used for applying a source signal Vs jointly; gates 13 and 13' of the two transistors T1 and T2 are used to for applying control signals Vg1 and Vg2 respectively; drains (Drain1, Drain2) 12 and 12' of the two transistors T1, T2 are connected to one end of each of the electrodes of different resistive switching cells which the number thereof is m in the resistive switching cells R1 and R2, . . . , Rn respectively, and the other ends of the electrodes of the resistive switching cells R1 and R2, . . . , Rn are used for applying different bit signals Vbit_1, Vbit_2, . . . , Vbit_m respectively.

The above-mentioned two transistors T1 and T2 are vertical channel transistors, which can be set on the semiconductor substrate. The gates 13 and 13' thereof are sidewall structures, and the sources 14 and 14' and the drains 12 and 12' are vertically asymmetrical structures, the sources 14 and 14' are on the top, the drain electrodes 12 and 12' are on the bottom, vertical conductive channels are formed by controlling of the sidewall gates 13 and 13', the sources 14 and 14' of the two transistors T1, T2 are shared, the two drains 12 and 12' can be connected to the resistive switching cells R1, R2, . . . , Rn through a subsequent interconnection process.

Electrodes of the above-mentioned resistive change cells R1, R2, . . . , Rn are connected in sequence to form a horizontal stack structure, and the same electrode is shared between any two adjacent resistive switching cells. Wherein, one end of each of the electrodes of the resistive switching cells are connected to the drains 12 and 12' of the transistors T1 and T2 respectively, and the other ends of the electrodes of the two electrodes thereof are connected to the bit signals Vbit_1, Vbit_2, . . . , Vbit_m respectively.

For example, the two transistors can be set on the semiconductor substrate 10, a dielectric layer is set on surface of the semiconductor substrate 10, and the resistive switching cells are set on the dielectric layer, and the two transistors T1, T2 and the resistive switching cells are connected by vias in the dielectric layer and metal interconnect lines 15 and 15'.

A raised cuboid 11 can be set on the surface of the semiconductor substrate, the common source 14 and 14' of the two transistors is set on top surface of the raised cuboid, the gates 13 and 13' of the two transistors are set on two sides of the raised cuboid respectively, the drains 12 and 12' of the two transistors are set on the semiconductor substrates adjacent to the two sides of the raised cuboid respectively; gate dielectric layers are set between the gates 13 and 13' and the semiconductor substrate 10, channels of the two transistors T1 and T2 are set in the raised cuboid jointly, and vertical channel structures are formed respectively.

In this way, layout area of the two transistors is equivalent to a planar MOS transistor; wherein, layout area of the sources of the two transistors is equivalent to gate of the planar MOS transistor, and layout area of the drains of the two transistors is equivalent to source and drain of the planar MOS transistor, the gates of the two transistors are corresponding to two gate sidewalls of the planar MOS transistor.

Each of the resistive switching cells is a horizontal sandwich structure and comprises a left electrode 16, a resistive switching layer 17 and a right electrode 18 which are set in sequence, any two adjacent resistive switching cells are connected with the respective left electrodes thereof or the respective right electrodes thereof, so as to form a common electrode.

Material of the left and right electrodes comprise Ta, Ti, Cu, W, Pt, TaN or TiN, material of the resistive switching layer comprises tantalum oxide, hafnium oxide or titanium oxide and media material which is compatible with a CMOS process.

Figure 6:
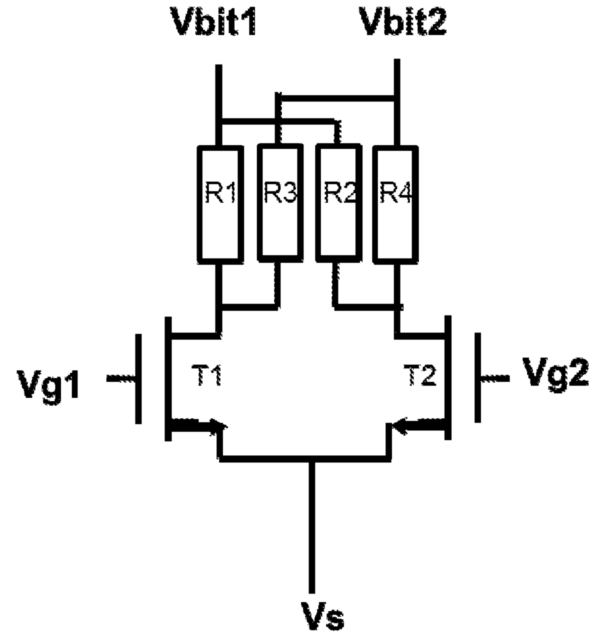
FIG. 6 is a schematic diagram of a circuit principle of a RRAM cell in a form of 2T4R according to a preferred embodiment of the present invention.
Figure 7:
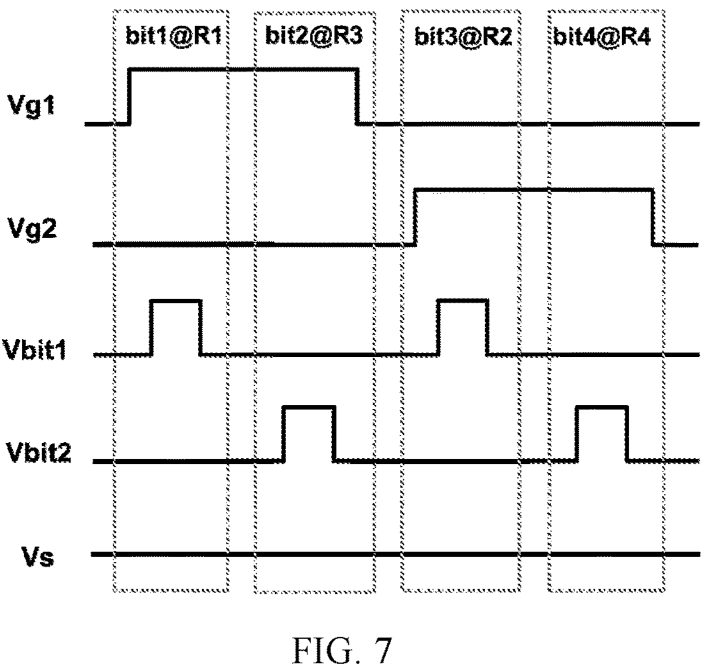
FIG. 7-8 are schematic diagrams of an operation of a RRAM cell in a form of 2TnR according to a preferred embodiment of the present invention.

Next, operational characteristics of a 2TnR cell of the present invention in detail with reference to the examples are described. Herein, for convenience of description, a 2T4R cell is taken as a specific example, a schematic diagram thereof is shown in FIG. 6. When performing a cell operation, a cell structure of the present invention can not only perform multiple binary storage, but also realize a multi-value storage function. Specifically, as shown in an operation embodiment shown in FIG. 7, in an operation cycle, when the transistor T1 or T2 is gated, there is one and only one bit signal Vbit to operate, that is, when the transistor T1 is gated (the control signal Vg1 is at a high level), the resistive switching cell R1 is operated by the bit signal Vbit1, and the resistive switching cell R3 is operated by the bit signal Vbit2; when the transistor T2 is gated, the resistive switching cells R2 and R4 are operated by the bit signals Vbit1 and Vbit2, so as to realize four binary storage operations in sequence.

Figure 8:
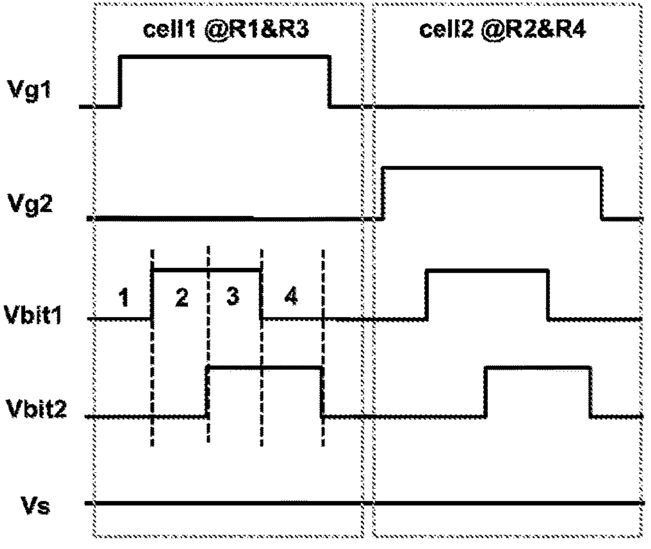
Figure 9:
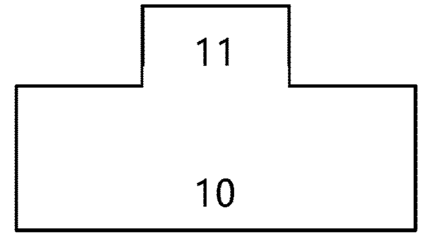
FIG. 9-12 are flowcharts of a fabrication process of a 2T transistor according to a preferred embodiment of the present invention.
Figure 10:
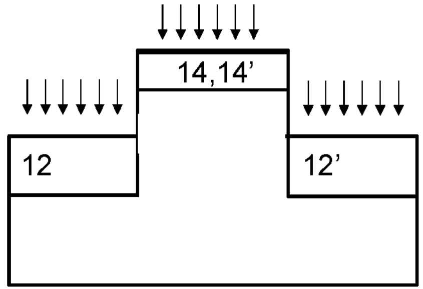
Figure 11:
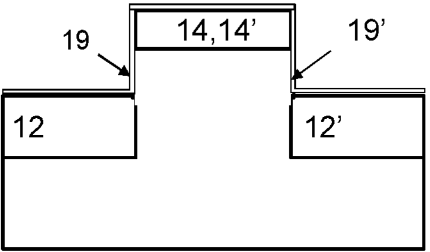
Figure 12:
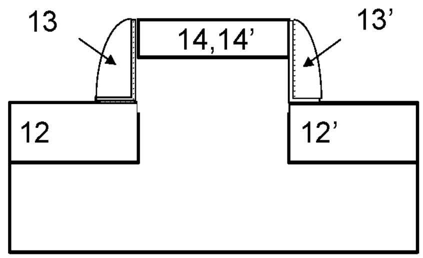
Figure 13:
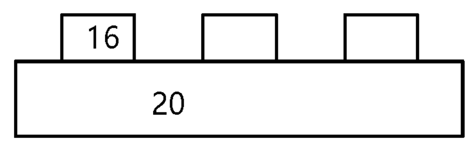
FIG. 13-16 are flowcharts of a fabrication process of an nR RRAM cell according to a preferred embodiment of the present invention.
Figure 14:
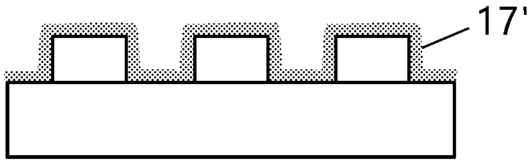
Figure 15:
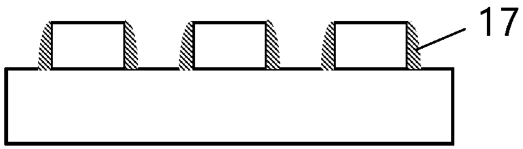
Figure 16:
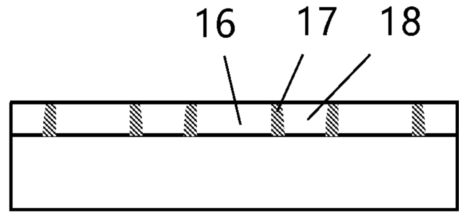

In another operation embodiment shown in FIG. 8, when the transistor T1 is gated (the control signal Vg1 is at a high level), the bit signals Vbit1 and Vbit2 have four states with different timing combinations, that is, the high and low resistance states of the resistive switching cells R1 and R3 can be combined into four different stable resistance states, and when the transistor T2 is gated, the resistive switching cells R2 and R4 can also be combined into four different stable resistance states, thus stable operations of multiple stored states can be realized in the operation cycle, which is the multi-value storage function.

Therefore, according to different operating voltages and timings of the signals Vg1, Vg2, Vs, Vbit_1, Vbit_2, . . . , Vbit_m, etc., the 2TnR cell of the present invention can take into account functions of binary storage and multi-value storage.

Next, a fabrication method for the above-mentioned 2TnR cell of the present invention will be introduced, which mainly comprises preparing vertical channel transistors T1, T2 and resistive switching cells R1, R2, . . . , Rn, connection between the two can be realized by a metal interconnection process of standard CMOS, which is not repeated herein.

As shown in FIG. 9-12, which are a general preparation process of the two vertical channel transistors T1 and T2 in the 2TnR cell, which can comprise following steps:

First, providing a planar silicon substrate 10, defining device regions of the two transistors T1 and T2 on the silicon substrate 10, specifically, standard CMOS processes such as photolithography and etching can be used to form the raised cuboid 11 on the silicon substrate in the device region;

Then, by an ion implantation process, forming the sources and drains of the two transistors T1 and T2 in the device regions of the transistors T1 and T2, by processes comprising a standard CMOS ion implantation process to prepare a common source 14 and 14' of the two transistors on the top surface of the raised cuboid 11, and forming the drains 12 and 12' of the two transistors on the semiconductor substrates 10 adjacent to the two sides of the raised cuboid 11 respectively;

Next, by a thermal oxidation process or an atomic layer deposition (ALD) process, on the two sides of the raised cuboid 11 and the semiconductor substrates 10 adjacent to the two sides of the raised cuboid 11, the gate dielectric layers of the two transistors T1 and T2 are formed respectively.

Then, by a self-aligned spacer process of standard CMOS processes, on the gate dielectric layers 19 and 19' on the two sides of the raised cuboid 11, the sidewall gates 13 and 13' of the transistors T1 and T2 are formed respectively.

Based on the above-mentioned fabrication processes of the transistors T1 and T2, the layout area of the drains of the two transistors T1 and T2 is equivalent to the source and drain of the planar MOS transistor; the layout area of the common source of the two transistors T1 and T2 is equivalent to the gate of the planar MOS transistor, and the sidewall gates of the two transistors T1 and T2 can be formed by the self-aligned spacer process without increasing layout area thereof, that is, the layout area of the two transistors T1 and T2 is equivalent to the planar MOS transistor, which also shows an outstanding advantage of the 2TnR structure proposed in the present invention in terms of cell area FIG. 13-16 show a rough fabrication process of the resistive switching cells R1, R2, . . . , Rn in the 2TnR cell, which can further comprise following steps after the above steps:

A CMOS back-end dielectric layer is formed on the surface of the silicon substrate 10, through holes and metal interconnection layers 15 and 15' are formed in the CMOS back-end dielectric layer and on the dielectric layer 20 above the metal interconnection layers, by standard CMOS processes comprise deposition, photolithography, etching and other processes, forming first electrodes (left electrodes) 16 on the dielectric layer, and the number of the first electrodes is m;

Then, by a PVD process or an ALD process, depositing resistive switching layer material 17' on surface and sidewall of the first electrodes to cover the first electrodes completely.

Next, by a spacer etching process, spacer resistive switching structures 17 are formed on two sides of the first electrodes 16, the number of the spacer resistive switching layer structures is n, and the number of the first electrodes 16 is m, wherein n is twice as large as m.

Next, a second electrode layer is deposited to cover the first electrodes 16, by a CMP process, second electrodes (right electrodes) 18 are formed between the first electrodes 16, the number of the second electrodes is m, thus the resistive switching cells R1, R2, . . . , Rn are formed, and the number of the resistive switching cells is m.

Wherein, the first electrodes 16 or the second electrodes 18 are electrodes shared between any two adjacent resistive switching cells, that is, the first electrodes 16 can be left electrodes (one end of each of the electrodes) which are connected to two adjacent resistive switching cells, and the second electrodes 18 can be right electrodes (the other ends of the electrodes) which are connected to two adjacent resistive switching cells; or, the first electrodes 16 can be a right electrode which are connected to two adjacent resistive switching cells, and the second electrodes 18 can be left electrodes which are connected to two adjacent resistive switching cells.

It can be seen from the above preparation process of the resistive switching cell that the resistive switching cells R1, R2, . . . , Rn of the present invention are actually horizontal sandwich structures which comprise the left electrodes, the resistive switching layer and the right electrodes. In specific implementations, material of the first electrodes and the second electrodes comprise Ta, Ti, Cu, W, Pt, TaN or TiN and others which are compatible with the CMOS process, and material of the resistive switching layer comprises tantalum oxide, hafnium oxide or titanium oxide and media material which is compatible with a CMOS process.

From the fabrication processes of the transistors and the RRAM cells in FIGS. 9-12 and 13-16, it can be seen that the fabrication method of the 2TnR cell of the present invention is completely compatible with the standard CMOS processes. Meanwhile, the self-aligned sidewall process technology is adopted for forming the transistors and the RRAM cells, which realizing to improve functions and performances of the resistive switching cell under the limited cell area, and fully reflects innovation and practicability of the present invention.

Finally, a simplified structure of the 2TnR cell of the present invention is introduced. If there are only two resistive switching cells, in addition to using two vertical transistors to form a 2T2R cell in the above manner, cell structure can be further simplified, and only one planar transistor is used to form a 1T2R cell.

Figure 17:
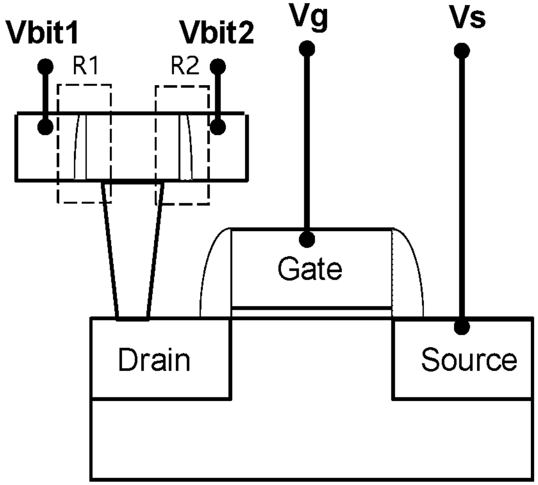
FIG. 17-18 are schematic structural diagrams of a 1T2R RRAM cell according to a preferred embodiment of the present invention.
Figure 18:
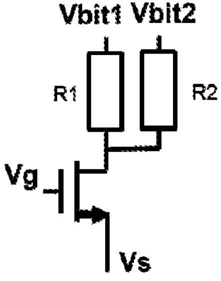

A schematic diagram thereof is shown in FIGS. 17-18. Wherein, similar to FIG. 5 (FIG. 6), electrodes of the two resistive switching cells are connected in sequence to form a horizontal stack structure, and one of the electrodes is shared between the two resistive switching cells; gate of the transistor is used for applying the control signal Vg respectively, source of the transistor is used for applying the source signal Vs; drain of the transistor is connected to one end of each of the electrodes of the two resistive switching cells, and the other ends of the electrodes of the two resistive switching cells are used for applying different bit signals Vbit1 and Vbit2 respectively.

The cell structure can also realize the functions of binary storage and multi-value storage, and fabrication method therefor completely adopts the standard CMOS processes, which greatly simplifies fabrication process of the cell structure.

The above descriptions are only the preferred embodiments of the present invention, and the described embodiments are not used to limit the scope of patent protection of the present invention. Therefore, any equivalent structural changes made using the contents of the description and drawings of the present invention should be included of the same reasoning. Within the protection scope of the appended claims of the present invention.

What is claimed is:

1. A resistive random access memory (RRAM) cell implemented on a semiconductor substrate, the RRAM cell having a planar, horizontal architecture, comprising:

two transistors disposed side-by-side on the semiconductor substrate, each having a gate, a source, and a drain;

a dielectric layer formed on a surface of the semiconductor substrate, and a metal interconnection layer disposed in the dielectric layer;

a plurality of resistive switching cells located on the dielectric layer, wherein the two transistors and the resistive switching cells are connected through the metal interconnection layer in the dielectric layer, electrodes of the resistive switching cells are connected in sequence to form a horizontal stack structure, and every two adjacent resistive switching cells within the plurality of resistive switching cells are divided into a resistive switching group so as to form multiple resistive switching groups, wherein a shared electrode node is located between every two adjacent resistive switching cells within each resistive switching group;

gates of the two transistors are configured to apply different control signals respectively, sources of the two transistors are connected together and configured to apply a source signal jointly; drains of the two transistors are connected to the electrodes of the resistive switching cells at two ends of each resistive switching group respectively, and the shared electrode nodes of the multiple resistive switching groups are configured to apply different bit signals respectively.

2. The RRAM cell of claim 1, wherein a raised cuboid is set on the surface of the semiconductor substrate, a common source of the two transistors is set on top surface of the raised cuboid, the gates of the two transistors are set on two sides of the raised cuboid respectively, the drains of the two transistors are set on the semiconductor substrates adjacent to the two sides of the raised cuboid respectively; gate dielectric layers are set between the gates and the semiconductor substrate, channels of the two transistors are set in the raised cuboid jointly, and vertical channel structures are formed respectively.

3. The RRAM cell structure of claim 2, wherein layout area of two transistors is equivalent to a planar MOS transistor; wherein, layout area of sources of the two transistors is equivalent to gate of the planar MOS transistor, and layout area of drains of the two transistors is equivalent to source and drain of the planar MOS transistor, the gates of the two transistors are corresponding to two gate sidewalls of the planar MOS transistor.

4. A fabrication method for the RRAM cell of claim 2, comprising:

S1: providing a planar silicon substrate, defining device regions of two parallel transistors on the silicon substrate, and forming the raised cuboid on the silicon substrate in the device region;

S2: forming the common source of the two transistors on the top surface of the raised cuboid, and forming the drains of the two transistors on the semiconductor substrates adjacent to the two sides of the raised cuboid respectively;

S3: forming the gate dielectric layers of the two transistors on the two sides of the raised cuboid and the surface of the semiconductor substrate adjacent to the two sides of the raised cuboid respectively;

S4: forming sidewall gates of the two transistors on the gate dielectric layers on the two sides of the raised cuboid respectively;

S5: forming a dielectric layer on the surface of the silicon substrate, forming a metal interconnection layer in the dielectric layer, and forming the resistive switching cells on the metal interconnection layer, and the number of the resistive switching cells is n.

5. The fabrication method of claim 4, wherein using a standard CMOS ion implantation process to form the sources and the drains, forming the gate dielectric layers by a thermal oxidation process or an atomic layer deposition process, and forming the gates by a self-aligned spacer process of standard CMOS processes.

6. The fabrication method of claim 4, wherein a method for forming the resistive switching cells specifically comprises:

S51: forming first electrodes on the dielectric layer, and the number of the first electrodes is m;

S52: depositing a resistive switching layer on surface of the first electrodes;

S53: forming a sidewall resistive switching layer on two sides of the first electrodes through a sidewall etching process;

S54: depositing second electrode layer material to cover the first electrodes, planarizing the second electrode layer material, and forming second electrodes between the first electrodes, and the number of the second electrodes is m, thereby forming resistive switching cells, and the number of the resistive switching cells is n; wherein, the first electrodes or the second electrodes are electrodes shared between any two adjacent resistive switching cells.

7. The RRAM cell structure of claim 1, wherein each of the resistive switching cells is a horizontal sandwich structure and comprises a left electrode, a resistive switching layer and a right electrode which are set in sequence, any two adjacent resistive switching cells are connected with the respective left electrodes thereof or the respective right electrodes thereof, so as to form a common electrode.

8. The RRAM cell structure of claim 7, wherein material of the left electrodes and the right electrodes comprise Ta, Ti, Cu, W, Pt, TaN or TiN, material of the resistive switching layer comprises tantalum oxide, hafnium oxide or titanium oxide.

* * * * *